(12) United States Patent
Lu et al.

(10) Patent No.: US 6,943,124 B1
(45) Date of Patent: Sep. 13, 2005

(54) TWO STEP EXPOSURE TO STRENGTHEN STRUCTURE OF POLYIMIDE OR NEGATIVE TONE PHOTOSENSITIVE MATERIAL

(75) Inventors: Shin-Rung Lu, Hsin-Chu (TW); Ho-Ku Lan, Jubei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 313 days.

(21) Appl. No.: 10/197,327

(22) Filed: Jul. 17, 2002

(51) Int. Cl.$^7$ .................. H01L 21/302; H01L 21/31
(52) U.S. Cl. .................. 438/781; 438/725; 438/746; 438/780
(58) Field of Search .................. 438/705, 796, 438/798; 430/322

(56) References Cited

U.S. PATENT DOCUMENTS

| | | | |
|---|---|---|---|
| 4,971,895 A | * 11/1990 | Sullivan | 430/328 |
| 5,194,365 A | * 3/1993 | Goodin et al. | 430/327 |
| 5,292,614 A | 3/1994 | Ochiai et al. | 430/270 |
| 5,360,698 A | * 11/1994 | Hanrahan | 430/324 |
| 6,184,151 B1 | 2/2001 | Adair et al. | 438/743 |
| 6,221,567 B1 | 4/2001 | Beilin et al. | 430/323 |
| 6,225,019 B1 | 5/2001 | Matsuda et al. | 430/270.1 |
| 6,329,306 B1 | 12/2001 | Nakao | 438/975 |
| 6,423,477 B1 | * 7/2002 | Engelen et al. | 430/321 |

* cited by examiner

*Primary Examiner*—Carl Whitehead, Jr.
*Assistant Examiner*—David L. Hogans

(57) ABSTRACT

A method is provided for forming features in a polyimide layer that is employed as an insulating layer or buffer layer during the fabrication of semiconductor devices or chip packaging structures. A pattern is formed in a photosensitive layer that has a high film retention after the development step and a crosslinked network that strengthens and stabilizes it for subsequent processing. The process involves exposing a negative tone photosensitive layer with a first exposure dose that is less than the normal dose used to image the material. The exposed layer is developed to provide a scum free substrate. A second exposure dose then strengthens the formed image by crosslinking unreacted components. First and second exposure doses are determined from a plot of film thickness loss vs. exposure energy. The method applies to photosensitive polyimide precursors as well as negative photoresists that are crosslinked by free radical or chemical amplification mechanisms.

32 Claims, 6 Drawing Sheets

TWO STEP EXPOSURE TO STRENGTHEN STRUCTURE OF POLYIMIDE OR NEGATIVE TONE PHOTOSENSITIVE MATERIAL

FIELD OF THE INVENTION

The invention relates to a method of fabricating a semiconductor device or chip packaging structure. More particularly, the present invention relates to patterning polyimide precursors or negative tone photosensitive compositions and processing to provide patterns with high structural strength and low defects.

BACKGROUND OF THE INVENTION

Polyimides are often selected as permanent layers in the fabrication of semiconductor devices or in chip packaging structures because of their excellent thermal stability to greater than 350° C., low k dielectric constants, and good mechanical properties. A popular application is to employ them as a buffer layer to protect underlying circuits from damage during assembly or other types of handling operations. Typically, a polyamic acid or polyamic ester layer containing an (—NH—) group and a —$CO_2R$ group where R=H or an alkyl substituent as shown in FIG. 1 is patterned with exposing radiation and then cured to form a cyclic imide structure with a nitrogen atom attached to two carbonyl groups as shown to the right of the arrow in FIG. 1. Other moieties that are usually aromatic in content are attached to the nitrogen atom and carbon atoms of the five membered ring to form a polymer chain. Substituents can be attached to the aromatic parts of a polyimide to provide flexibility to adjust the thermal, electrical and mechanical properties of the polymer. The curing process to form the imide structure usually requires heating at temperatures up to 350° C. for at least an hour to complete the cyclization reaction.

A pattern in a polyimide layer is usually formed as part of the device manufacturing process. One option is to pattern a photoresist on a polyamic acid or ester layer and then use the photoresist as an etch mask in a wet etch pattern transfer process as described in U.S. Pat. No. 6,221,567. The wet etch is isotropic and creates an opening in the polyamic acid layer that is of non-uniform width since the top of the opening which is exposed to the etchant for a longer time has a larger space width than the bottom of the opening. Generally, a vertical profile where the top and bottom of the opening or space have the same width is desirable in lithography. However, when space widths are several microns or larger, the slope of the sidewall is not as critical. The wet etch process in the cited patent involves alternating the etchant and DI water treatments several times which is time consuming and can be difficult to control.

An alternate method is to pattern a photoresist on a polyimide layer followed by a dry plasma etch transfer of the pattern through the polyimide. This method will create an opening with vertical sidewalls in the polyimide. However, since the two layers are both composed of organic materials, the etch selectivity is poor and the height of the etch mask is decreased at about the same rate as the hole is formed in the polyimide layer. This forces one to coat a photoresist layer approximately as thick as the polyimide which can be several microns thick. An option is to use a bilayer imaging system in which a thin layer of photoresist is patterned on a relatively thick underlayer whose optical properties can be adjusted so that it functions as an anti-reflective layer during the lithography process. The pattern is etch transferred through the underlayer which can then serve as an etch mask for a subsequent dry plasma etch through the underlying polyimide layer.

It should be noted that a variety of exposure tools are available to print patterns in photosensitive layers. The minimum resolution that can be achieved in a printed pattern is defined by the equation $R = k\lambda/NA$ where R is the minimum feature size that can be resolved, k is a constant, $\lambda$ is the exposure wavelength, and NA is the numerical aperture of the exposure tool. While exposure tools having mercury lamps that emit g-line (436 nm) or i-line (365 nm) radiation have been the workhorses of the industry for printing feature sizes above 1 micron as required for polyimide layers, the trend in newer technologies has been to move to smaller wavelengths such as 248 nm from KrF excimer lasers or 193 nm from ArF excimer lasers to achieve smaller feature sizes. Since polyamic esters tend to contain a large amount of aromatic groups which have a high optical absorbance below about 260 nm, their usefulness in 248 nm exposure methods is limited. However, photoresists have been developed that can resolve sub-micron feature sizes following 248 nm or 193 nm exposures.

Commercial photosensitive compositions including photoresists and polyamic esters are available in two general types that are referred to as positive tone and negative tone formulations. These solutions are spin coated on a substrate or a layer on a substrate and are dried by baking in an oven or on a hot plate to form a film. The dried film is patternwise exposed with radiation that passes through a mask having regions that are opaque and transparent to incident radiation. In positive tone films, the exposed regions corresponding to transparent regions on the mask become soluble in a developer solution that is typically an aqueous base. Unexposed regions in the film that correspond to opaque regions on the mask remain insoluble in the developer. For negative tone materials, exposed regions become insoluble in a developer while the unexposed regions remain soluble and are washed away. The thickness of the photosensitive film can vary from about 0.2 microns to several microns.

The negative tone imaging process can involve a crosslinking mechanism that is initiated when a photosensitive component absorbs energy from the exposing radiation and generates a free radical. The free radical ($R^-$) then reacts with another component that contains a $C_1=C_2$ double bond to form a new bond between the radical and one of the carbon atoms while the other carbon atom becomes a radical. The newly formed carbon radical ($R—C_1—C_2^-$) can react with another $C_3=C_4$ double bond to form ($R—C_1—C_2—C_3—C_4^-$). If the two carbon-carbon double bonds just mentioned are attached to two different polymer chains, a new link or crosslink has been formed by the radical propagation process. Other double bonds attached to other polymer chains can also react to form a crosslinked network consisting of several polymer chains. Eventually, the carbon radical becomes terminated and the free radical reaction ends. Since two or more polymers have been tied together by the crosslinked network, the molecular weight (MW) of the newly formed crosslinked polymer is higher than the individual units from which it was formed. As a result, the solubility of the crosslinked polymer is less than the starting polymers. Depending on the MW of the original polymers, a few crosslinks are all that might be needed to convert a soluble polymer into an insoluble network of polymers. This solubility difference is the basis for forming a pattern in an exposed negative tone film using a developer such as an aqueous base solution.

Negative tone compositions that operate by a chemical amplification mechanism are popular because of a low dosage required for imaging that enables a higher throughput than free radical types. Such an application is described in U.S. Pat. No. 5,292,614 for a composition comprising a polyvinyl phenol (poly-4-hydroxystyrene) that is capable of crosslinking through its hydroxyl groups, a monomer having more than one acid labile group that forms an intermediate carbonium ion, and a photoacid generator that produces a strong acid upon exposure. One acid molecule is capable of generating several crosslinks that renders the exposed region insoluble in aqueous base developer. The rate of the crosslinking reaction is usually increased by a post-exposure bake in order for the crosslinking to be essentially complete in less than two minutes so that it is compatible with a high throughput process. This type of composition is especially useful for imaging with Deep UV radiation (248 nm). However, those skilled in the art will recognize that photoresist compositions based on a chemical amplification mechanism can be optimized for mid-UV or near-UV imaging with wavelengths in the 300 nm to 600 nm range. One drawback of this approach is that chemically amplified (CA) films must be exposed in a carefully controlled environment so that parts per billion (ppb) concentrations of airborne bases such as ammonia do not neutralize the photoacid and inhibit the chemically amplified reaction. When CA films are coated on an underlying layer such as polyimide that may have trace amounts of basic materials, an intermediate layer is usually inserted as a chemical barrier to prevent bases from migrating into the chemically amplified film and inhibiting the image forming process.

When printing feature sizes of about 0.25 micron or greater, a negative tone photosensitive film is preferred in some cases because it has a smaller proximity effect than a positive tone layer. For example, when a design on a mask or reticle has different feature sizes to be printed simultaneously, the resulting feature sizes in the patterned film will be closer to their intended sizes in a negative tone film than when the same pattern is printed in positive tone film. A photoresist feature involving a crosslinked polymer also tends to have a higher thermal stability than one which is not crosslinked which makes a negative tone composition more attractive in certain applications from a thermal stability standpoint.

A good lithography process whether it involves a negative or positive tone material, photosensitive polyimide or photoresist, is characterized by its process latitude. An acceptable process window for manufacturing depends on the minimum feature size but generally a depth of focus (DOF) of at least 0.5 to 1 micron and a dose latitude of greater than 10% is desired for sub-micron features. In other words, the best focus setting may drift up to 1 micron and the dose to print the image to the targeted size may vary by up to 10% because of topography or reflectivity variations on the substrate but the resulting feature size can still be maintained within a +/−10% tolerance of the intended linewidth or space width. When features sizes are larger than 1 or 2 microns as is generally true for polyamic ester patterns, the DOF is likely to be larger than 1 micron and exposure latitude may be 30 to 40% or even higher.

In addition to a large process window, a high quality image involving vertical sidewalls and a square top to the profile is generally desired. The lithography process itself can be modified to provide a better quality image. U.S. Pat. No. 6,225,019 mentions a double exposure method of a positive tone photoresist. Two masks with differing contrast are used to expose a photoresist layer and then the pattern is developed to give a feature with a smaller linewidth than can be formed with only one exposure.

Double exposure methods are possible because not all of the photosensitive component reacts during the initial exposure. In fact, a majority of a photoinitiator in a free radical reaction and generally over 90% of a photoacid generator in a chemically amplified process may remain intact after a first exposure. In negative tone compositions, there are unreacted crosslinkable components such as alkenes with C=C double bonds or acid labile groups remaining after the first exposure so that a second reaction after a second exposure can proceed.

Another double exposure method in U.S. Pat. No. 6,184,151 is used to print photoresist images with square corners and to overcome line end rounding and foreshortening that occurs in patterns printed by normal lithographic techniques. In the preferred embodiment, a photoresist is imaged, etched and stripped followed by coating a second photoresist, exposing to form an image orthogonal to the first, then etching and stripping the second resist. The extra steps are not conducive to a high throughput, low cost process and are most valuable for a mask making process where a slower throughput is acceptable.

A good photoresist or polyamic ester imaging layer should also retain a maximum amount of thickness after the development step. The photoresist layer is often used as an etch mask for a subsequent etch transfer step and a sufficient thickness is necessary to prevent the etchant from consuming the photoresist layer and reaching the protected underlying layer. For polyimide precursor layers that are cured to form polyimides, a sufficient thickness is required to provide good insulator properties in the case of chip packaging. One can compensate for thickness loss during development of photosensitive layers by increasing the starting thickness but this usually results in a smaller process latitude when there is a significant change in thickness. One can also minimize thickness loss by changing the composition of the imaging layer or by optimizing the process. A process change is often more desirable since it can be more quickly implemented in manufacturing.

One concern associated with exposing and developing a negative tone imaging layer is that when the dose reaches a certain level, scum or residue can remain in unexposed regions that should have been dissolved and washed away in developer. Exposure wavelengths reflected off the substrate can enter regions that are not intended to be exposed or a photoacid or free radical can migrate outside the exposure region to begin a crosslink reaction in unexposed areas. The crosslinked area may be insoluble in developer and a thin film that is typically a fraction of the original film thickness remains on the substrate in areas that are intended to be clear of photosensitive material. This phenomenon generally occurs next to an imaged feature 22 and the residue or scum 30 extends away from the feature 22 a short but variable distance on substrate 20 as depicted in FIG. 2a and FIG. 2b.

Another double exposure method is described in U.S. Pat. No. 6,329,306 and improves the overlay of a contact hole pattern on a line/space pattern in a photoresist film. When applied to a negative tone photoresist, the develop step is assumed to take place after the second exposure and not following the first exposure. Some parts of the resulting pattern are exposed once and some twice. Those that are exposed twice should have a higher crosslinking content and will better withstand the erosion that occurs at the top of the exposed negative tone photoresist when developer is applied. Since a different mask is used for each exposure step, the shape of the final pattern changes as a result of the second exposure. While some portions of the final pattern have a better film retention as a result of the second exposure, the benefit is not uniformly applied across the entire pattern on the substrate.

Therefore, a method which has good film retention in exposed regions across the entire pattern while avoiding scum that can occur with high exposure doses is needed in order to improve negative tone imaging processes. A method that simultaneously strengthens and stabilizes the resulting pattern to thermal or etch treatment is also desirable. The method should also be compatible with a high throughput, low cost manufacturing process.

SUMMARY OF INVENTION

One objective of the present invention is to provide a means of strengthening the pattern formed when a negative tone composition is exposed and developed to give features that contain crosslinked polymers.

A further objective of the present invention is to provide a method of forming features with a good retention of film thickness in negative tone photoresist or photosensitive polyimide precursor films A still further objective of the present invention is to provide a process for imaging a negative tone photoresist or photosensitive polyimide precursor that avoids scumming in regions that are intended to be clear of photosensitive material after the develop step.

A still further objective of the present invention is to provide a low cost, high throughput method of forming stabilized negative tone patterns during the manufacture of semiconductor devices or chip packing structures.

These objectives are achieved by providing a negative tone photosensitive film on a substrate which is patternwise exposed to radiation that is less than the normal dose required to print the pattern to a targeted feature size with a single exposure. The substrate is developed for a shorter period of time than when an exposure with a higher dose is applied. A second dose in a flood exposure mode is then provided without a mask at an energy which saturates the crosslinking capability of the film so that the maximum number of crosslinks can be formed that strengthen and stabilize the film for subsequent processing. The initial dose is determined by plotting film thickness loss vs. exposure energy from an exposure matrix. The slope of the portion of the curve at low doses is extended toward the x-axis to form a line that intersects with a horizontal line drawn through the points on the curve at high doses where film thickness retention is constant. The intersection of the two lines corresponds to the preferred dose for the first exposure as shown by point X in FIG. 10. The second exposure dose is performed with no mask and is determined as the dose corresponding to the lowest energy point on the horizontal line as represented by point Y in FIG. 10.

In one embodiment, a photosensitive polyimide precursor is patterned on a substrate. After the double exposure method, the layer is cured to force a cyclization reaction that forms an imide structure as illustrated in FIG. 1 by heating to at least 350° C. for about 60 minutes. In a second embodiment, a negative tone photoresist that crosslinks by a free radical mechanism is coated on a polyimide precursor layer. Following the double exposure method, the pattern in the photoresist is wet etch transferred through the polyimide precursor layer. Any remaining photoresist is removed by conventional stripping methods. The polyimide precursor is then cured as in the first embodiment. In a third embodiment, a negative tone photoresist that crosslinks by a chemically amplified reaction is coated on an intermediate layer that serves as a chemical barrier between a cured polyimide layer and the photoresist The photoresist is patterned according to the double expose method and the resulting pattern is etch transferred through the intermediate layer which then functions as an etch mask for the subsequent etch through the underlying polyimide layer. Preferably, the barrier layer has a high etch selectivity in relation to the polyimide layer so that the thickness of the barrier can be much thinner than the underlying polyimide. The barrier layer and any remaining photoresist are removed by conventional stripping methods. This technique potentially yields patterns with smaller space widths and feature sizes than the previous embodiments.

The advantage of the present invention is that film thickness loss in the retained film after the first exposure is minimized while scum in regions intended to be clear of photoresist or polyimide precursor is avoided. This greatly reduces the amount of developer needed per substrate and significantly lowers the amount of rework involving additional develop time to remove scum or stripping the photosensitive layer and repeating the coating and patterning process if scum cannot be developed away. The extra processing from rework in prior art can introduce defects that will lower the yield and reliability of the final device. Another benefit is that the retained film after the second exposure has a higher mechanical strength than in prior art methods. The second exposure enables the maximum amount of crosslinks to form between polymer chains which in turn provides a higher thermal stability than previously realized. Since the second exposure is done without a mask, it can be accomplished at low cost in a less expensive flood exposure tool because overlay and a fine control of the exposure process are not important. The second exposure also avoids the need for a second expensive mask as required in other double exposure methods. The present invention is applicable to a wide variety of exposure tools and wavelengths. It is also compatible with a wide variation of polyimide film thicknesses and feature sizes in the printed pattern.

DETAILED DESCRIPTION OF THE INVENTION

The present invention is a method of forming a pattern in a polyimide layer that is employed as an insulating layer or buffer layer during the fabrication of semiconductor devices or chip packaging structures. A stabilized pattern with a high film retention after the development step is initially formed in a negative tone photosensitive polyimide precursor or in a negative tone photoresist and has a crosslinked network that strengthens it for subsequent etch or thermal processing.

Figure 3A:
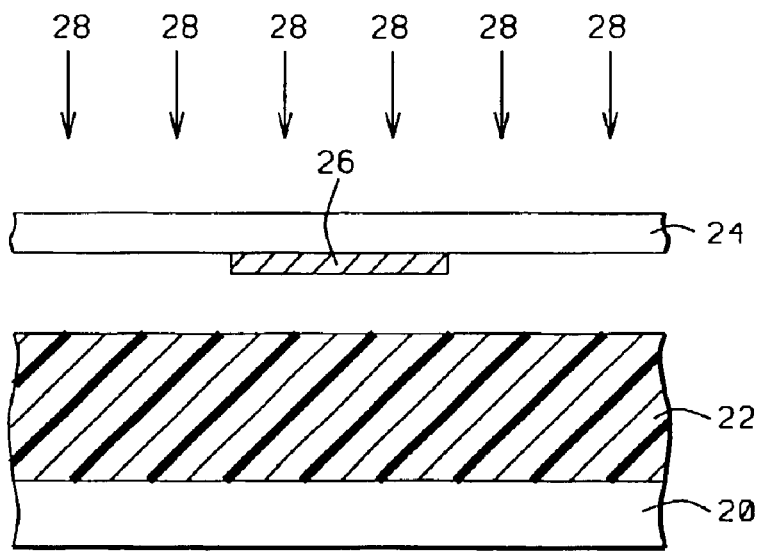
FIGS. 3a–3c are cross-sectional views of a photosensitive polyimide precursor that is patterned and cured according to an embodiment of the present invention.
Figure 3B:
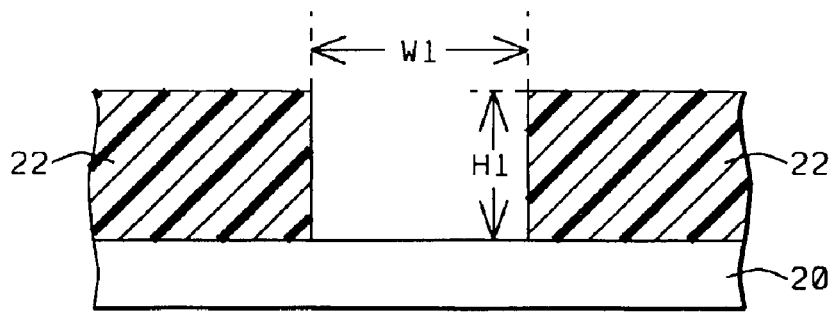
Figure 3C:
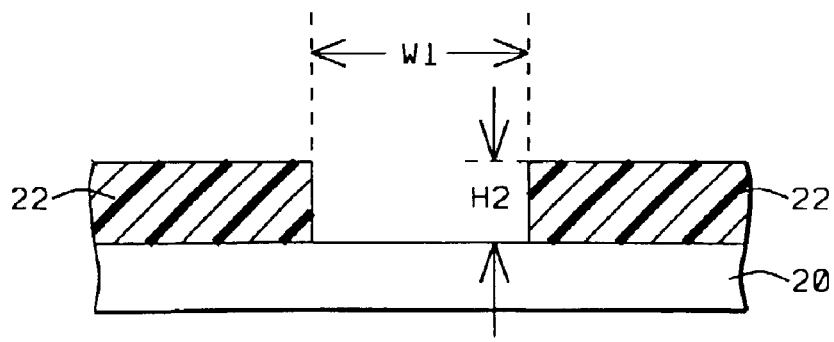

In the first embodiment as depicted in FIGS. 3a–3c, a substrate 20 is provided upon which a negative photosensitive polyimide precursor film 22 has been spin coated. The precursor material is typically a polyamic acid or polyamic ester. The thickness of film 22 can vary from a few microns to more than 10 microns and is preferably in a range of 8 to 10 microns after a low temperature bake that is, for example, about 100° C. for 5 minutes. Substrate 20 is silicon, ceramic or other appropriate materials that are common in semiconductor device manufacturing processes. Referring to FIG. 3a, a reticle or mask comprised of a transparent substrate 24 such as quartz and an opaque patterned coating 26 which is typically chrome or chromium is positioned between the exposure source 27 and the substrate 20. Radiation 28 from the exposure tool is blocked by opaque regions 26 on the mask and is transmitted through regions in quartz 24 which are not covered by chrome 26.

Exposure tools are referred to as scanners or steppers depending upon the type of movement performed to cover the entire surface of film 22 with exposure patterns. Normally, an area called an exposure field about 2 cm×2 cm in size is exposed with each step in an exposure sequence across the substrate and a total of about 50 to about 100 such fields are exposed to cover the entire surface area depending on the substrate size. The preferred radiation is g-line (436 nm) or i-line (365 nm) when the targeted feature size is greater than 1 micron. When radiation penetrates film 22, a free radical reaction is initiated and polymer chains are crosslinked. In unexposed regions of film 22, no reaction occurs.

Figure 1:
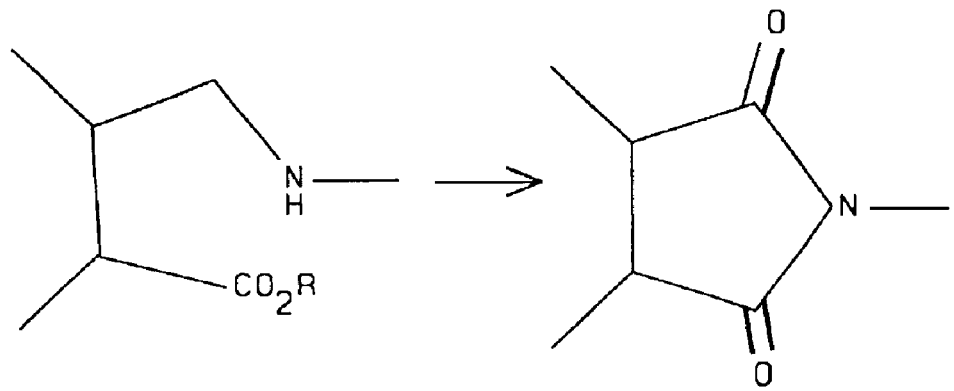
FIG. 1 is a drawing of an imide precursor that is converted to a cyclic imide structure by heating. Other aromatic groups and substituents not shown are attached to the cyclic imide and form a polyimide.
Figure 2A:
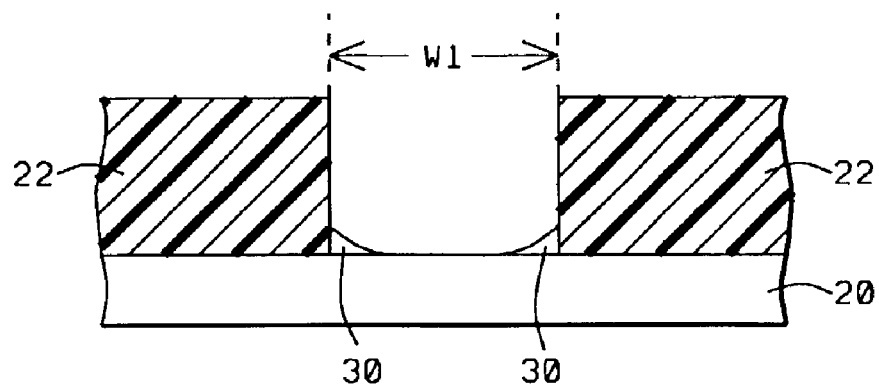
FIG. 2a is a cross-sectional view and FIG. 2b is a top down view of negative tone images in which scum has been formed on the substrate during the development step.

Substrate 20 is then developed in an aqueous base that is typically a dilute solution of tetrabutyl ammonium hydroxide or dilute KOH solution. The substrate 20 is either dipped in a solution of developer or is preferably developed by spraying or a combined spray/puddle method in a track equipped with a spin bowl and chuck to hold a substrate. A DI water rinse and drying step completes the develop cycle. When a single exposure method is followed by a spray/puddle develop method, scum 30 as pictured in FIG. 2a and FIG. 2b has a tendency to occur on substrate 20 in regions that are intended to be clear of photosensitive material. A longer develop time can possibly remove most of the residue 30 but some can remain along the edge of film 22, especially in the corner areas as in the lower left corner of substrate 20 in FIG. 2b.

The inventors have discovered that a modified exposure process can successfully avoid residue or scum formation after the develop step. A two step exposure is performed. The initial exposure is the same as depicted in FIG. 3a involving a patterned mask except that the dose is lower than used with a single exposure. After film 22 is exposed, substrate 20 is developed for a shorter time than required for the single exposure method to give a pattern with openings having space width $W_1$ and height $H_1$ in film 22 as shown in FIG. 3b. Space width $W_1$ can vary from 1 or 2 microns to more than 10 microns. The substrate 20 is then subjected to a flood exposure without a mask and with g-line or i-line radiation or preferably with a broadband radiation with wavelengths from about 300 nm to about 600 nm from a less expensive exposure tool. Unreacted photoinitiator and carbon-carbon double bonds remaining intact after the first exposure react at this point to form a more extensive crosslinked polymer network than after the first exposure. This additional crosslinking strengthens the pattern to withstand higher thermal and mechanical stresses than afforded by a single exposure method.

Figure 6:
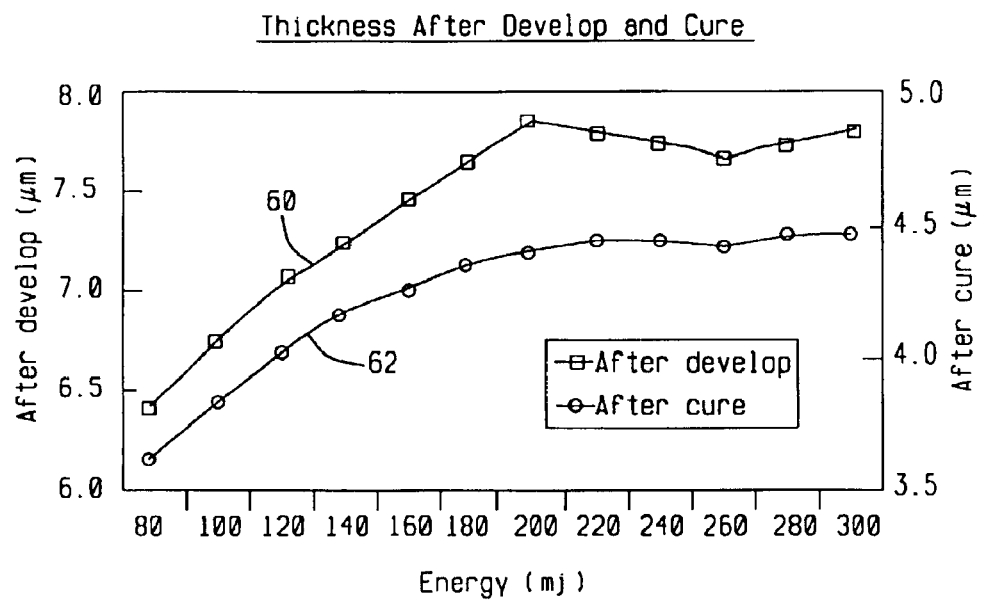
FIG. 6 is a graph showing film thickness retention after developing and curing a negative tone photosensitive polyimide precursor as a function of the exposure energy in a single exposure process.
Figure 7:
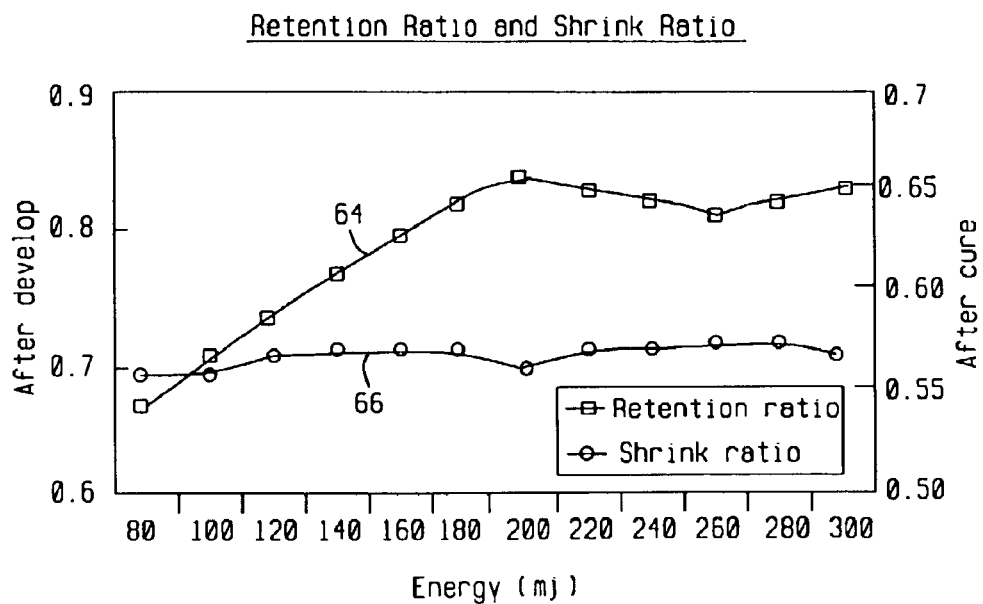
FIG. 7 is a graph showing retention ratio and shrink ratio after curing a polyimide precursor as a function of exposure energy in a single exposure process.
Figure 8:
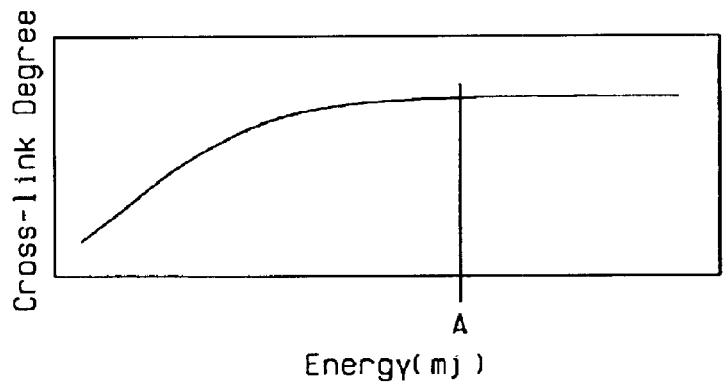
FIG. 8 is a plot showing the degree of crosslinking in a negative tone photosensitive layer as a function of the exposure energy.

Film thickness loss for layer 22 in FIG. 3b is directly related to the extent of crosslinking in the film. FIG. 8 shows that the relationship of crosslinking to exposure energy of radiation 28 in FIG. 3a is an exponential curve that reaches a plateau at a saturation point A where all the crosslinking sites have reacted and no further reaction occurs. The flat portion of the curve in FIG. 8 closely resembles the flat portion of the upper curve 60 in FIG. 6 where thickness $H_1$ remaining in layer 22 after the develop step reaches a plateau at a certain exposure energy. Therefore, film thickness loss decreases as the extent of crosslinking increases in film 22. The lower curve 62 in FIG. 6 represents the thickness $H_2$ remaining in film 22 after curing the polyimide precursor. FIG. 7 shows that the shrink ratio or $H_2/H_1$ on curve 66 is nearly constant and is independent of film thickness $H_1$ after the develop step. However, the retention ratio represented by curve 64 which is ($H_1$/original thickness of film 22) varies according to exposure dose.

A lower cost flood exposure tool is preferred for the second exposure because precise alignment of one pattern on another and high performance imaging that are qualities of more expensive g-line and i-line steppers and scanners are not needed. No develop is necessary after the second exposure since the polymer network has a maximum number of crosslinks and film 22 is no longer soluble in aqueous base. Dimension $W_1$ is fixed and will not change as a result of the second exposure. Following the second exposure, the patterned polyimide precursor is cured by baking to 350° C. for 1 hour. The film thickness shrinks to a height of $H_2$ that is usually about 50% to 60% of $H_1$ as shown in FIG. 3c. Space width remains at an average width $W_1$ although the sidewall may deform slightly during the heat treatment such that the bottom of the opening has a space width slightly smaller than $W_1$ while the top has a space width slightly larger than $W_1$.

Figure 9:
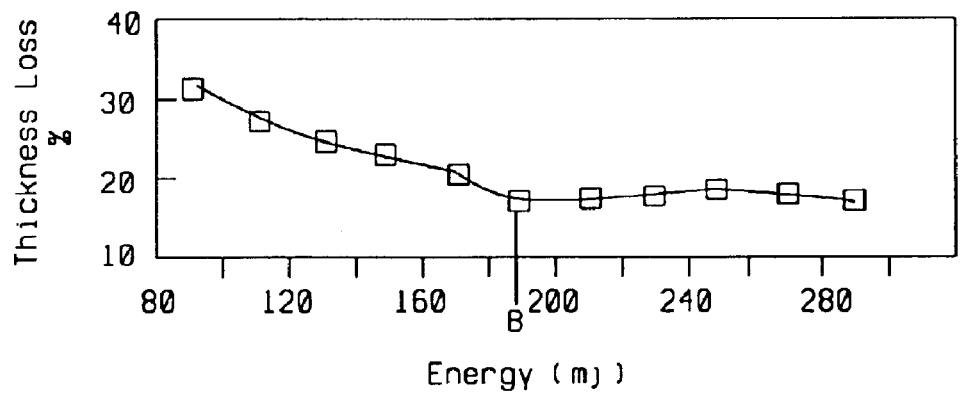
FIG. 9 is a graph showing % thickness loss in a negative tone photosensitive layer as a function of exposure energy in a single exposure process.

The appropriate doses for the first and second exposures are determined according to the following procedure. It should be noted that for any lithographic process, a focus/exposure matrix is usually performed first to determine the exposure range and best focus that provides the targeted feature sizes and generates features in the pattern with the most vertical sidewalls. In this case, a polyimide precursor film 22 is coated on a substrate 20 as shown in FIG. 3a and the exposure pattern is modified to provide a dose matrix at a predetermined best focus condition such that each exposure field on film 22 is given a different exposure dose. At least ten different doses are applied and a range of 15 to 20 doses is preferred so that the increment in dose between each step can be kept to a small fraction of the total dose. The substrate 20 is developed using the same process employed in the original focus/expose matrix. The thickness remaining in each of the exposure fields is measured and compared to the original film thickness after coating and baking. Film retention for each exposure site is expressed as a per cent (%) value where the numerator is the thickness after the develop step and the denominator is the film thickness after coating and baking. A graph which has exposure energy in mJ/cm$^2$ on the x-axis and % thickness loss on the y-axis is used to show the results from the exposure matrix as illustrated in FIG. 9. Note that thickness loss decreases as exposure energy increases until it reaches a saturation point B where thickness loss remains constant at higher doses.

Figure 10:
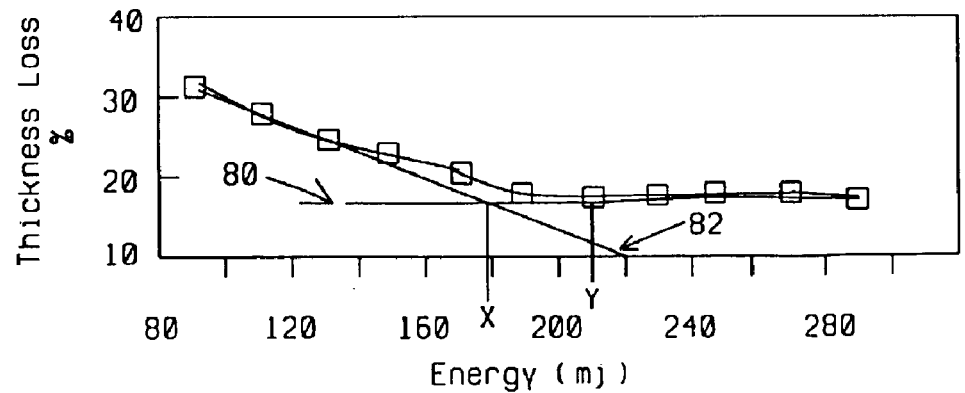
FIG. 10 is a drawing that demonstrates how a first exposure dose and a second exposure dose are determined according to the present invention.

Referring to FIG. 10 to further explain how first and second exposure doses are selected, a straight line 82 is formed by drawing a line through the straight portion of the curve in FIG. 9 at the lower energy doses, preferably from about 30% thickness loss to about 20% thickness loss. The line is extended toward the x-axis until it intersects a horizontal line 80 drawn through the high energy points on the curve where the film thickness loss remains constant. The intersection point corresponds to the energy level X on the x-axis recommended for the first exposure dose. Normally, when only one exposure dose is used as in prior art, the dose is higher than X and is a point on the horizontal part of the curve in FIG. 9. The dose for the second exposure is point Y which corresponds to the lowest energy point on horizontal line 80.

Figure 2B:
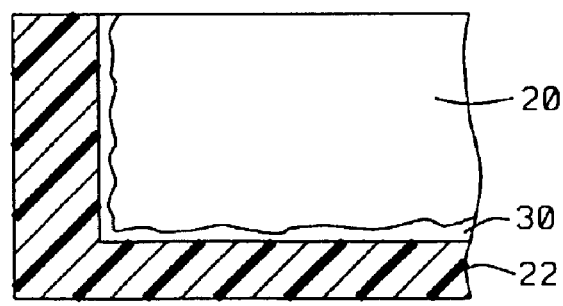

A benefit of the two exposure method with less develop time is to reduce or eliminate the tendency for scum formation in patterned films. An example is provided for Durimide 7510, a photosensitive polyamic ester available from Arch Microelectronic Materials. Durimide 7510 was coated on a substrate and baked at 100° C. for 5 minutes to give approximately 10 micron ($\mu$m) thick films. One substrate was given a first exposure similar to point X in FIG. 10. The substrate was then developed with Arch developer A-515 for 52 seconds followed by rinsing with DI water and drying. There was no scum in unexposed regions on substrate 20 where the film was washed away when the pattern was viewed through a microscope. The substrate 20 then received a second dose similar to point Y in FIG. 10. The Durimide 7510 pattern on the substrate was cured by heating to 350° C. for 1 hour in an oven. The second substrate was exposed with a single dose of radiation corresponding to a point on line 80 that has an energy equal to or greater than Y and developed for 52 seconds in A-515 developer. There was considerable scum on the substrate in unexposed regions as depicted in FIG. 2b. When the develop time for the single exposure process was lengthened to 75 seconds, some residue still remained in corners of the pattern as represented in FIG. 2b. Additional develop time is necessary before the substrate can proceed to a curing step and this is costly in terms of extra chemicals, substrate inspection time, and develop tool process time. In some instances, the scum cannot be removed with longer develop times and the substrate is reworked by stripping the pattern and recoating and re-exposing film 22.

Since film thickness $H_1$ in FIG. 3b is slightly lower with the new double exposure method than when a single exposure as in prior art is used, a compensation is made by increasing the starting thickness of layer 22 in FIG. 3a by about 10%. The small adjustment in Durimide 7510 thickness does not degrade the process window for the patterning step and the mechanical properties such as stress in the film 22 in FIG. 3c are not affected as summarized in Table 1.

TABLE 1

Durimide 7510 film thickness adjustment with double expose method

| Method | Film thickness after prebake | Film thickness after develop | Film thickness after curing | Stress (Mpa) |
|---|---|---|---|---|
| Present invention | 10.42 $\mu$m | 7.80 $\mu$m | 4.50 $\mu$m | 3.49E+07 |
| Prior art | 9.34 $\mu$m | 7.73 $\mu$m | 4.47 $\mu$m | 3.48E+07 |

The second exposure is relatively inexpensive because it can be performed by a low cost method on a flood exposure tool without the need for a second mask. Any additional expense incurred by a second exposure is more than offset by savings in less developer, less rework, and fewer defects resulting from less scum on unexposed and developed regions of substrate. Since a lower exposure dose is required with the mask pattern in the first step, the throughput on expensive steppers and scanners is actually increased which lowers the overall cost of producing the device. The crosslinked polymer network after the second exposure provides a more stable film in terms of physical and thermal properties. With methods involving only a single exposure, some free radicals can survive after a develop step, thereby causing reactions in the patterned film that can change its physical properties over time.

Figure 4A:
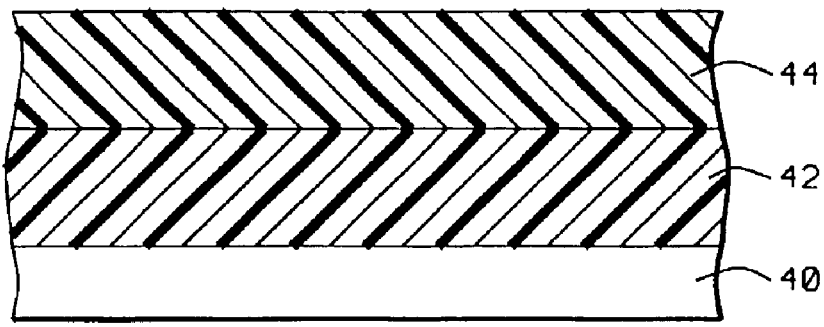
FIGS. 4a–4c are cross-sectional views of a negative photoresist that is patterned on a polyimide precursor layer in the second embodiment of the present invention.
Figure 4B:
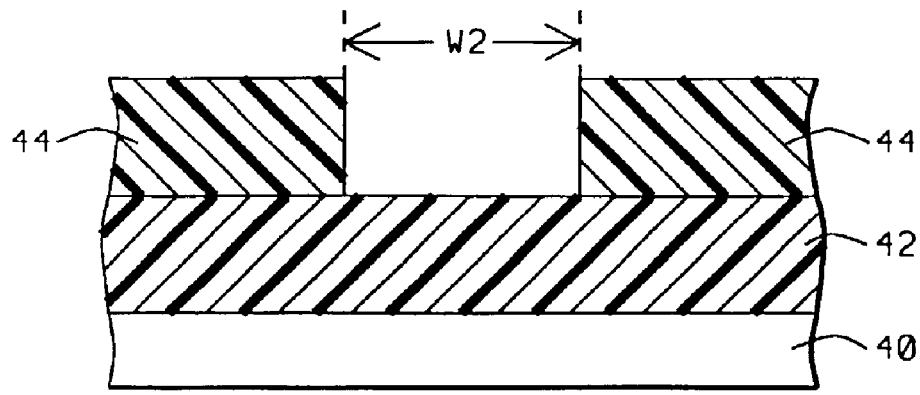

In a second embodiment, the photosensitive composition is a negative tone photoresist formulation that is crosslinked by a free radical mechanism. Referring to FIG. 4a, the negative tone photoresist 44, hereafter referred to as negative resist, is spin coated on a polyimide precursor layer 42 that is on substrate 40. Negative resist 44 is patterned in the same manner as depicted in FIG. 3a with exposing radiation 28 from an exposure source and a mask comprised of a transparent substrate 24 and an opaque pattern 26. Layer 44 can be exposed with one or more wavelengths of radiation selected from a region extending from about 600 nm to about 300 nm including g-line (436 nm) and i-line (365 nm). Negative resist 44 is developed in an aqueous base solution to provide a pattern as shown in FIG. 4b with a space width $W_2$ that can range from 1 or 2 microns to over 10 microns. Layer 44 can be several microns thick and is preferably 2 microns or less in thickness.

A second exposure dose is then applied in the absence of a mask with the same exposure tool as used for the first dose or preferably with a less expensive flood exposure tool that does not have alignment capability and can expose the entire substrate without scanning or stepping. First and second doses are determined according to the description provided for FIG. 10 in the first embodiment in which a plot of film thickness loss as a function of exposure energy is drawn based on an exposure matrix of layer 44. The pattern in layer 44 is transferred into polyimide precursor 42 by a wet etch that is well known to those skilled in the art and typically involves treatment with an aqueous base solution followed by a DI water rinse. The width of the space $W_2$ in layer 42 can become wider at the top of the opening than at the bottom because the top portion of film 42 is exposed to the etchant for a longer period of time. In that case, layer 42 is etched until space width $W_2$ is achieved at the bottom of the layer even though the top is wider than $W_2$. Negative photoresist 44 is then removed by conventional means and layer 42 is cured to convert to a polyimide structure which remains in the final device.

Figure 4C:
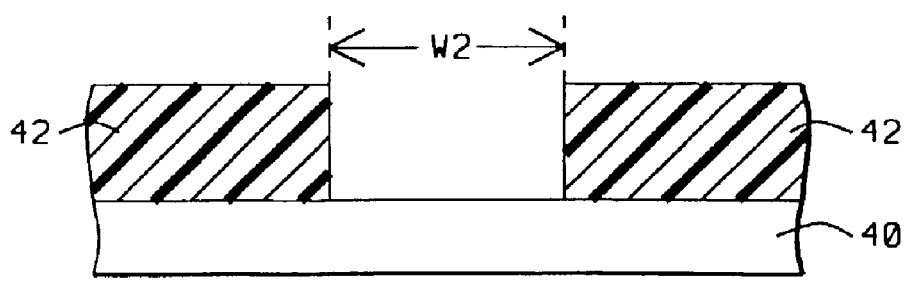

An option in the second embodiment is to replace the polyimide precursor 42 with a cured polyimide before coating layer 44. The thickness of layer 42 should be adjusted downward to approximately the same thickness as layer 42 in FIG. 4c after the polyimide precursor has been cured. The expose and develop sequence remains the same as described previously for the first and second embodiment. Once the space width $W_2$ is formed and the structure is strengthened by saturating the polymer network with crosslinks in a second exposure, the pattern is transferred through polyimide layer 42 by a dry plasma etch rather than a wet etching. The plasma etch is performed using conventional etch chemistry associated with organic films. The rate of hole formation in layer 42 is approximately equal to the rate of film thickness loss in layer 44. Therefore, the thickness of 44 is about the same as that of layer 42 when etch selectivity is near 1:1. As a result, layer 44 is usually consumed during the etch transfer when oxygen plasma is used by converting compounds consisting of the elements C, N, S, and H to their corresponding oxides. Substrate 40 with patterned layer 42 may be cleaned by standard methods after the etch step is completed in order to remove any traces of negative resist 44.

The advantage of the second embodiment is that the double exposure method forms clean patterns with width $W_2$ in the photosensitive layer 44 so there is no residue on underlying layer 42 in openings of the pattern. Moreover, the extra crosslinking in patterned layer 44 afforded by the second exposure strengthens layer 44 for the subsequent etch transfer step. The clean patterns provide higher yields with fewer defects which reduces the cost of the manufacturing process. In addition, there is less developer consumption and less exposure time in expensive exposure tools. The dry etch step is an advantage over wet etch transfer when a vertical sidewall in the pattern in layer 42 is desired. It should also be noted that the sidewall in the opening of the pattern in layer 42 is likely to be more vertical after the dry etch in the second embodiment than following the curing step in the first embodiment.

In a third embodiment, the photosensitive composition is a negative tone photoresist formulation that is crosslinked by a chemical amplification mechanism. Since a chemically amplified (CA) resist is sensitive to trace amounts of bases such as amines that are likely to be present in a polyimide layer, an intermediate layer is inserted between the cured polyimide and the negative resist. This embodiment provides a potentially smaller space width $W_3$ than $W_1$ or $W_2$ afforded by the other embodiments because of the higher resolution of CA resists and the possibility of performing a pattern transfer with a more selective etch.

Figure 5A:
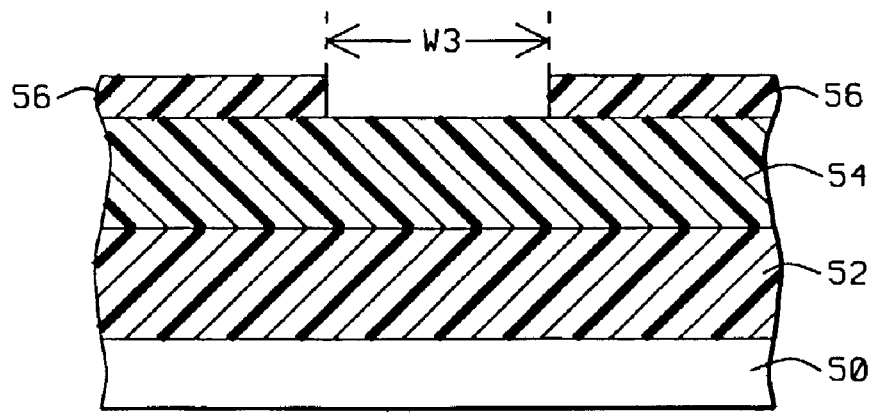
FIGS. 5a–5c are cross-sectional views of a negative photoresist that is patterned on a barrier layer according to the third embodiment of the present invention.
Figure 5B:
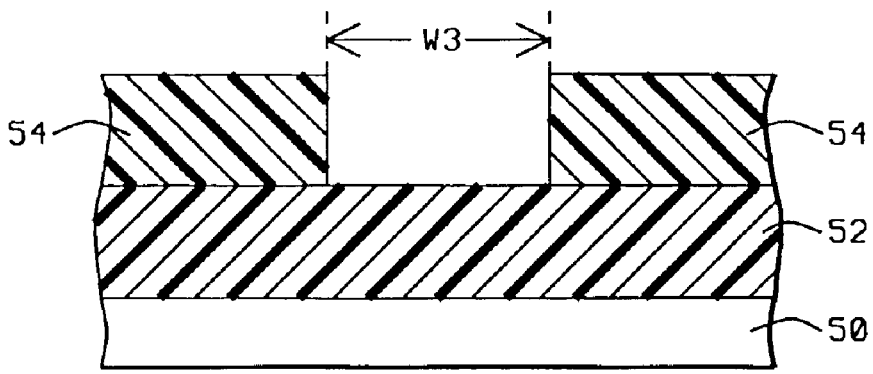

Referring to FIG. 5a, a cured polyimide layer 52 is provided on a substrate 50. A barrier layer 54 is then deposited by spin coating, a CVD method, or by sputtering. This layer primarily functions as a chemical barrier but is also useful as an etch stop or for its anti-reflective properties during patterning a photoresist above it. Suitable materials may be organic such as an underlayer in a bilayer resist, inorganic such as a silicon nitride or a silicon oxynitride layer, or a metal like aluminum. A negative CA resist solution is spin coated on barrier layer 64 and baked to form a resist film 56 that can vary from 0.2 microns to 2 microns thick but preferably less than one micron thick. Negative resist 56 is patterned in the same manner as depicted in FIG. 3a with exposing radiation 28 from an exposure source 27 and a mask comprised of a transparent substrate 24 and an opaque pattern 26. Resist 56 is patternwise exposed with one or more wavelengths of radiation selected from a region extending from about 600 nm to about 200 nm including g-line (436 nm), i-line (365 nm), and Deep UV (248 nm) wavelengths. Negative resist 56 is developed in an aqueous base solution to provide a pattern as shown in FIG. 5b with a space width $W_3$ that can range from less than 1 micron to over 10 microns.

A second exposure dose is then applied in the absence of a mask with the same exposure tool as used for the first dose or preferably with a less expensive flood exposure tool that does not have alignment capability and can expose the entire substrate without scanning or stepping. First and second doses are determined according to the description provided for FIG. 10 in the first embodiment in which a plot of film thickness loss as a function of exposure energy is drawn based on an exposure matrix of layer 56. The pattern in layer 56 is transferred into barrier layer 54 with a dry plasma etch using a conventional chemistry. The thickness of 54 can vary from about 100 Angstroms for a material that has a high etch selectivity relative to organic layers to about 1 micron thick for organic materials that have a 1:1 etch selectivity relative to polyimide. Negative resist 56 is removed by a conventional stripping process after etch transfer into barrier layer 54 to give a structure as shown in FIG. 5b. However, a stripping step can be omitted if the photoresist layer will be consumed anyway in the subsequent etch process.

Figure 5C:
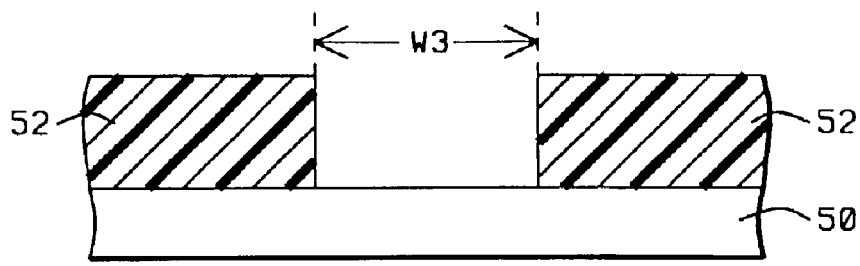

A second plasma etch is then performed to transfer the pattern in layer 54 into polyimide 52. The appropriate etch chemistry for this transfer depends on the material in layer 54 and is known to those skilled in the art. Layer 54 is then stripped by a conventional method to afford patterned layer 52 with width $W_3$ illustrated in FIG. 5c.

The advantage of the third embodiment is that the double exposure method forms clean patterns with width $W_3$ in the photosensitive layer 56 so there is no residue on underlying layer 54 in openings of the pattern. Moreover, the extra crosslinking in patterned layer 56 afforded by the second exposure strengthens layer 56 for the subsequent etch transfer step. The clean patterns provide higher yields with fewer defects which reduces the cost of the manufacturing process. In addition, there is less developer consumption and less exposure time in expensive exposure tools. The dry etch transfer through a barrier layer into an underlying polyimide layer provides a combination of smaller space width than afforded by other embodiments and vertical sidewalls in the opening of the pattern in polyimide 52.

While this invention has been particularly shown and described with reference to, the preferred embodiment thereof, it will be understood by those skilled in the art that various changes in form and details may be made without departing from the spirit and scope of this invention.

We claim:

1. A method of forming a pattern with improved structural strength in a negative tone photosensitive film comprising:
   (a) coating a single photosensitive solution on a substrate and baking to form a single photosensitive film,
   (b) exposing said substrate with a patterned mask and first exposure dose that does not completely crosslink the photosensitive film,
   (c) developing said exposed photosensitive film in an aqueous base solution, and
   (d) exposing said developed photosensitive film without a mask and a second exposure dose that is higher than first exposure dose to form a saturated crosslinked network,
   (e) wherein a develop time after said first exposure dose is less than required for a develop time with a single exposure method having a higher dose than said first exposure dose.

2. The method of claim 1 wherein the photosensitive solution consists of a photoinitiator and a polyamic acid or polyamic ester having a crosslinkable component in an organic solvent.

3. The method of claim 2 wherein the thickness of said photosensitive film is within a range of about 1 to about 10 microns.

4. The method of claim 2 wherein said first exposure is performed with a scanner or stepper using one or more wavelengths selected from a range of about 300 nm to about 600 nm.

5. The method of claim 1 wherein said first exposure dose is determined by a process comprising:
   plotting a graph of thickness loss on the y-axis and exposure energy on the x-axis, said measurements resulting from a dose matrix of said photosensitive film on said substrate,
   drawing a straight line through points on said graph at low exposure energies that preferably represent a thickness loss in the range of about 20% to about 30% and extending said line toward the x-axis,
   drawing a horizontal line through points representing higher doses where film thickness loss is constant and extending said line toward the y-axis, and
   drawing a first vertical line downward on said graph from the intersection point of the two aforementioned lines, said first vertical line intersecting the x-axis at the preferred first exposure dose.

6. The method of claim 5 wherein the second exposure dose is determined by drawing a second vertical line downward on said graph from the lowest energy point on said horizontal line, said second vertical line intersecting the x-axis at the preferred second dose.

7. The method of claim 1 wherein said second exposure dose is preferably from a broad band exposure tool without alignment capability and which can expose the entire substrate without stepping or scanning.

8. The method of claim 2 further comprising the step of heating the photosensitive film after said second exposure to a temperature of about 350° C. for about 1 hour to convert the polyimide precursor into a patterned polyimide.

9. The method of claim 1 wherein said photosensitive solution is a negative photoresist that consists of a photoinitiator and a polymer having a crosslinkable component in an organic solvent.

10. The method of claim 1 wherein said photosensitive solution is a negative photoresist that consists of a polyvinyl phenol, a crosslinker with acid labile groups, and a photoacid generator in an organic solvent.

11. The method of claim 9 wherein said first exposure is performed with a scanner or stepper using one or more wavelengths selected from a range of about 300 nm to about 600 nm and wherein said second exposure dose is from a broad band exposure tool without alignment capability and which can expose the entire substrate without stepping or scanning.

12. The method of claim 10 wherein said first exposure is performed with a scanner or stepper using one or more wavelengths selected from a range of about 200 nm to about 600 nm and wherein said second exposure dose is from a broad band exposure tool without alignment capability and which can expose the entire substrate without stepping or scanning.

13. A method of forming a pattern in a polyimide layer on a substrate, said polyimide is suitable as a permanent insulating layer or buffer layer in semiconductor devices or chip packaging structures, said method comprising:

(a) providing a polyimide precursor film on a substrate, (b) coating a photosensitive solution on said polyimide precursor and baking to form a photosensitive film, (c) exposing said substrate with a patterned mask and first exposure dose that does not completely crosslink the photosensitive film, (d) developing said exposed substrate in an aqueous base solution, (e) exposing said substrate without a mask and a second exposure dose that is higher than first said exposure dose to form a saturated crosslinked network, (f) transferring the pattern through the polyimide precursor layer with a wet etch, (g) removing the photosensitive film with a stripping process, and (h) curing the polyimide precursor layer by baking to about 350° C. for about 1 hour to form a patterned polyimide layer, (i) wherein a develop time after said first exposure dose is less than required for a develop time with a single exposure method having a higher dose than said first exposure dose.

14. The method of claim 13 wherein said photosensitive film is a negative tone photoresist comprised of a photoinitiator and a polymer having a crosslinkable component.

15. The method of claim 13 wherein said first exposure is performed with a scanner or stepper using one or more wavelengths selected from a range of 300 to 600 nm and preferably 365 nm or 436 nm and wherein said second exposure dose is from a broad band exposure tool without alignment capability and which has an exposure field that can cover the entire surface of said substrate.

16. The method of claim 13 wherein the develop time after said first exposure dose is less than required for the develop time with a single exposure method having a higher dose than said first exposure dose.

17. The method of claim 13 wherein the wet etch is accomplished with a dilute solution of aqueous base, preferably KOH or tetrabutyl ammonium hydroxide in water.

18. The method of claim 13 wherein said polyimide layer has approximately the same space widths and feature sizes as the pattern in said polyimide precursor.

19. A method of forming a pattern in a polyimide layer on a substrate, said polyimide is suitable as a permanent insulating layer or buffer layer in semiconductor devices or chip packaging structures, said method comprising:

(a) providing a cured polyimide film on a substrate, (b) coating a photosensitive solution on said polyimide layer and baking to form a photosensitive film, (d) exposing said substrate with a patterned mask and first exposure dose that does not completely crosslink the photosensitive film, (e) developing said exposed substrate in an aqueous base to form a pattern, (f) exposing said substrate without a mask and a second exposure dose that is higher than first said exposure dose to form a saturated crosslinked network in said pattern, (g) transferring said pattern through the polyimide layer with a plasma etch, and (h) removing any remaining photosensitive film with a stripping process (i) wherein a develop time after said first exposure dose is less than required for a develop time with a single exposure method having a higher dose than said first exposure dose.

20. A method of forming a pattern in a polyimide layer on a substrate, said polyimide is suitable as a permanent insulating layer or buffer layer in semiconductor devices or chip packaging structures, said method comprising;
   (a) providing a cured polyimide film on a substrate,
   (b) depositing a barrier layer on said polyimide film,
   (c) coating a photosensitive solution on said barrier layer and baking to form a photosensitive film,
   (d) exposing said substrate with a patterned mask and first exposure dose that does not completely crosslink the photosensitive film,
   (e) developing said exposed substrate in an aqueous base to form a pattern,
   (f) exposing said substrate without a mask and a second exposure dose that is higher than first said exposure dose to form a saturated crosslinked network in said pattern,
   (g) transferring said pattern through the barrier layer with a plasma etch,
   (h) removing the photosensitive film with a stripping process, and transferring said pattern through the polyimide layer with a plasma etch, and
   (i) stripping the barrier layer,
   (j) wherein a develop time after said first exposure dose is less than required for a develop time with a single exposure method having a higher dose than said first exposure dose.

21. The method of claim 20 wherein said barrier layer is an organic, inorganic, or metal layer that has a high plasma etch selectivity to the cured polyimide layer.

22. The method of claim 20 wherein said barrier layer is silicon nitride or silicon oxynitride.

23. The method of claim 20 wherein said photosensitive film is a negative tone photosensitive comprised of a polyvinyl phenol, a crosslinkable component with acid labile groups, and a photoacid generator.

24. The method of claim 20 wherein the said first exposure is performed with a scanner or stepper using one or more wavelengths selected from a range of about 200 nm to about 600 nm and preferably 248 nm, 365 nm or 436 nm and wherein said second exposure dose is from a broad band exposure tool without alignment capability that can expose the entire substrate without scanning or stepping.

25. The method of claim 20 wherein said pattern in said polyimide layer is comprised of space widths or feature sizes smaller than 2 microns and preferably less than 1 micron.

26. The method of claim 20 wherein the photosensitive layer and barrier layer form a bilayer imaging scheme wherein the optical properties are matched such that the barrier layer also serves as an anti-reflective layer.

27. The method of claim 20 wherein said barrier layer is aluminum.

28. The method of claim 20 wherein the develop time after said first exposure dose is less than required for the develop time with a single exposure method having a higher dose than said first exposure dose.

29. The method as in claim 1, wherein said substrate comprises a polymide precursor film formed on a base substrate and further comprising, after said exposing said developed photosensitive,
   (e) transferring the pattern through the polymide precursor layer with a wet etch,
   (f) removing the photosensitive film with a stripping process, and
   (g) curing the polymide precursor layer by baking to about 350° C. for about 1 hour to form a patterned polymide layer.

30. The method as in claim 1, wherein said substrate comprises a barrier layer formed on a polymide film formed on a base substrate and further comprising, after said exposing said developed photosensitive without a mask:
   (e) transferring the pattern through the barrier layer with a plasma etch,
   (f) removing the photosensitive film with a stripping process, and transferring said pattern through the polymide layer with a plasma etch, and
   (g) stripping the barrier layer.

31. The method as in claim 1, wherein said coating comprises coating a negative tone photosensitive solution on a substrate and said baking comprises baking to form a negative tone photosensitive film.

32. A method of forming a pattern with improved structural strength in a negative tone photosensitive film comprising:
   (a) coating a negative tone photosensitive solution on a substrate and baking to form a negative tone photosensitive film,
   (b) exposing said substrate with a patterned mask and first exposure dose that does not completely crosslink the photosensitive film,
   (c) developing said exposed photosensitive film in an aqueous base solution, and
   (d) exposing said developed photosensitive film without a mask and a second exposure dose that is higher than first exposure dose to form a saturated crosslinked network,
   (e) wherein a develop time after said first exposure dose is less than required for a develop time with a single exposure method having a higher dose than said first exposure dose.

* * * * *